United States Patent [19]

Mizutani et al.

[11] Patent Number: 4,642,880
[45] Date of Patent: Feb. 17, 1987

[54] METHOD FOR MANUFACTURING A RECESSED SEMICONDUCTOR DEVICE

[75] Inventors: Yoshihisa Mizutani, Tokyo; Syunzi Yokogawa, Yokohama, both of Japan

[73] Assignee: Kabushiki Kaisha Toshiba, Kawasaki, Japan

[21] Appl. No.: 724,152

[22] Filed: Apr. 17, 1985

[30] Foreign Application Priority Data

Apr. 19, 1984 [JP] Japan ................... 59-79133

[51] Int. Cl.⁴ .................... H01L 21/308; H01L 29/78
[52] U.S. Cl. .................... 29/576 B; 29/571; 29/578; 29/580; 29/576 W; 148/1.5; 148/DIG. 82; 148/DIG. 85; 357/41; 357/49; 357/56; 156/649; 156/647
[58] Field of Search ............ 29/571, 576 B, 578, 29/580, 576 W, 579; 148/1.5, DIG. 50, DIG. 82, DIG. 85, DIG. 86, DIG. 69; 357/41, 49, 55, 56, 59; 156/649, 647

[56] References Cited

U.S. PATENT DOCUMENTS

| 3,514,844 | 6/1970 | Bower et al. | 29/571 |
| 4,453,306 | 6/1984 | Lynch et al. | 29/591 X |
| 4,455,193 | 6/1984 | Jeuch et al. | 156/662 X |
| 4,486,943 | 12/1984 | Ryden et al. | 29/576 B X |
| 4,492,008 | 1/1985 | Anantha et al. | 29/576 W X |

Primary Examiner—Brian E. Hearn
Assistant Examiner—David A. Hey
Attorney, Agent, or Firm—Finnegan, Henderson, Farabow, Garrett & Dunner

[57] ABSTRACT

A method for manufacturing a semiconductor device comprises a first step of forming a field insulation layer on a p-type semiconductor substrate and a second step of forming an n⁺-type region and n-type region in an element area surrounded by the field insulation layer. In particular, the second step includes a step of forming, in the element area, a recess having an inclined portion and flat bottom portion, a step of forming an $SiO_2$ film of a uniform thickness on the inclined portion and flat bottom portion, and a step of ion-implanting an n-type impurity into the substrate through the $SiO_2$ and effecting an annealing process.

11 Claims, 13 Drawing Figures

METHOD FOR MANUFACTURING A RECESSED SEMICONDUCTOR DEVICE

BACKGROUND OF THE INVENTION

This invention relates to a method for manufacturing a semiconductor device and in particular a method for manufacturing a semiconductor device having an element area, surrounded by a field insulation layer, in a semiconductor substrate.

Recently, the memory cells of semiconductor devices have a tendency to be made in microminiaturized form so as to enhance, for example, an integration density. The surface area of the semiconductor substrate is divided by the formation of a field insulation layer into a plurality of element areas where corresponding memory cells are formed. Each memory cell is electrically insulated from other memory cells due to the field insulation layer.

An erasable and programmable read only memory (EPROM) includes, for example, n-channel floating gate MOS transistors as memory cells, one of which is shown in FIG. 1. In the arrangement shown in FIG. 1, a field insulation layer 10 is formed on a p-type semiconductor substrate 12 and a p+-type region is formed in that portion of the substrate 12 which is located immediately below the field insulation layer 10. Source and drain regions, which are n+-type regions 16A and 16B, respectively, are formed in an element area defined by the field insulation layer 10 in contact with the p+-type region 14. The element area is covered by an insulation layer 18. A floating gate electrode 20 is formed through an insulation layer 18 on the channel region which lies between the n+-type regions 16A and 16B. A control gate electrode 22 is formed on the floating gate electrode 20 on the insulation layer. The insulation layer 24 covers the control gate electrode, floating gate electrode 20 and field insulation layer. Source and drain electrodes 26A and 26B are ohmically connected to the n+-type regions 16A and 16B, respectively, through corresponding holes which extend through insulation layers 24 and 18.

In FIG. 1, the p+-type region 14 is so provided as to prevent the conductivity type of the substrate 12 from being inverted to an n-type immediately below the field insulation layer 10 due to the fixed charges of the field insulation layer 10 and an electric field resulting from an interconnection layer, not shown, on the insulation layer 24. The occurrence of such an inversion phenomenon causes a short-circuiting current to flow between the n+-type regions 16A, 16B of one element area and those of another element area.

In a programming operation in a case where the floating gate MOS transistor is used as the memory cell, a high voltage of about 20 V is applied between the control gate electrode 22 and drain electrode 26B in order to charge the floating gate electrode 20 with hot electrons. The hot electrons are generated between the n+-type regions 16A and 16B upon application of the high voltage. In this case, a voltage on the n+-type region 16B can be held within a range not exceeding a breakdown voltage between the n+-type region 16B and the p+-type region 14. In the MOS transistor in FIG. 1, the breakdown voltage between the n+-type region 16B and p+-type region 14 largely depends upon the impurity concentration level of the p+-type region 14. This is because, in order to set the n+-type region 16B at a lower resistive value, the n+-type region 16B is set to a high impurity concentration level of about $10^{20}$ cm$^{-3}$, and because the p+-type region is higher in its impurity concentration level than the semiconductor substrate. The impurity concentration level may be about $5 \times 10^{16}$ cm$^{-3}$ as an upper limit, taking into consideration the fact that a reverse bias voltage of 20 V is applied to the pn junction between the n+-type region 16B and the p+-type region 14.

There is a tendency of the field insulation layer 10 to be thinly formed due to the microminiaturization of the memory cells. In consequence, there is a high substantial possiblity that an inversion phenomenon will occur in the conductivity type of the p+-type region 14 which is located immediately below the field insulation layer 10. This phenomenon can be prevented by further increasing the impurity concentration level of the p+-type region 14, as has been done in practice. However, an increase in the impurity concentration level of the p+-type region 14 causes a drop in the breakdown voltage between the n+-type region 16B and the p+-type region 14. If the impurity concentration of the p+-type region 14 is set at a level exceeding the above-mentioned upper limit, it is not allowed to apply a voltage of 20 V to the n+-type region 16B. From this it may be said that the structure of the memory cell or a floating gate MOS transistor in FIG. 1 is not suitable for the high integration of memory devices.

FIG. 2 shows an already known memory cell, which is the same as the floating gate MOS transistor of FIG. 1 except that an n-type region 28 is formed between a p+-type region 14 and an n+-type region 16B. This memory cell allows a relatively high breakdown voltage between the n-type region 28 and the p+-type region 14.

In the manufacture of the memory cell as shown in FIG. 2 the conventional technique requires two impurity diffusion or ion-implantation steps in forming the n+-type region 16B and n-type region 28. Furthermore, a material for use as a mask pattern needs to be subjected to a patterning process in the step of the impurity diffusion. In the memory cell of FIG. 2, the n-type region 28 is located outside the n+-type region 16B, requiring a wide element area in comparison with that shown in FIG. 1.

SUMMARY OF THE INVENTION

It is accordingly the object of this invention to provide a method for reliably manufacturing semiconductor devices, in a lesser number of steps, which must be adequately electrically insulated by a field insulation layer from one another in microminiaturized areas.

According to this invention, there is provided a method for manufacturing a semiconductor device which comprises a first step of surrounding a surface portion of a semiconductor substrate of a first conductivity type as an element area, a second step of forming an inclined portion and flat portion adjacent the inclined portion in the element area, a third step of forming a covering layer of a predetermined thickness on the surface of the flat portion and inclined portion, and a fourth step of forming a first region of the second conductivity type in that portion of the semiconductor substrate which is located below the flat portion and a second region of the second conductivity type at an impurity concentration level lower than that of the first region in that portion of the semiconductor substrate which is located below the inclined portion by ion-implanting an impurity of the second conductivity type in a direction perpendicular to the flat portion through the covering layer and carrying out an annealing process.

According to this invention, a covering layer of a predetermined thickness is formed on the surface of the inclined portion and flat portion. In the ionimplantation step of the fourth step, the impurity ions are required to penetrate the covering layer, by a distance corresponding to the thickness of the covering layer, when they are migrated toward the flat portion and to penetrate the covering layer, by a distance longer than the abovementioned distance, when they are migrated toward the inclined portion. In other words, the impurity ions are smaller in number when they reach the first area of the substrate below the inclined portion than when they reach the second area of the substrate below the flat portion. This means that the regions of the second conductivity type can be formed in a mutually contacting state in a single common step.

DETAILED DESCRIPTION OF THE PREFERRED EMBODIMENT

Figure 1:
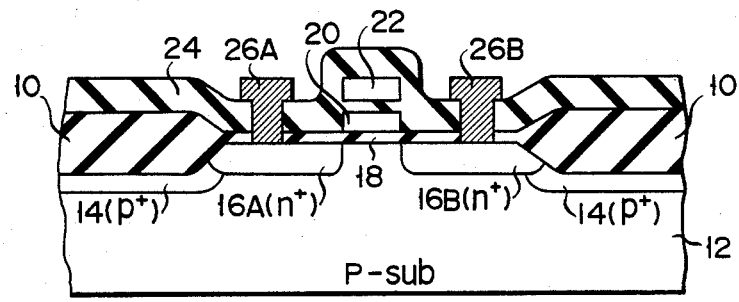
FIG. 1 is a cross-section showing a memory cell for a conventional EPROM.
Figure 2:
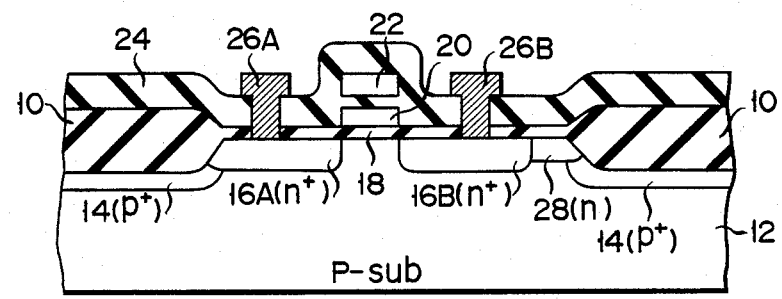
FIG. 2 is a cross-section showing a memory cell for a conventional EPROM, which is similar to the memory cell of FIG. 1.
Figure 3:
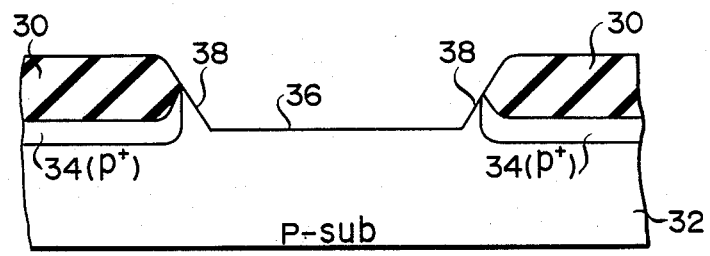
FIG. 3 is a view for explaining one step in the manufacture of an EPROM memory cell as conceived by the inventors.

The process of this invention conceived by the inventors will be explained below by referring to FIG. 3.

Where a memory cell shown, for example, in FIG. 2 is manufactured by the conventional technique, it is operated with adequate reliability. The inventors pay attention to the redundancy with which the memory cell is manufactured as set out above and have conceived, and reduced to practice, a method of manufacturing a memory cell as shown in FIG. 3. In FIG. 3, a field insulation layer 30 surrounds a surface portion of a semiconductor substrate 32 as an element area, and a p+-type region 34 is formed in the substrate 32 such that it is located immediately below the field insulation layer 30. The element area is subjected to an anisotropic etching step with the field insulation layer 30 as a mask pattern to provide a recess having a bottom or flat portion 36 and inclined portion 38 between the flat portion 36 and the field insulation layer 30. In this state, an n-type impurity is ion-implanted in the substrate 32 and subjected to an annealing step to form an n+-type region at the flat bottom 36 and an n-type region at the inclined portion 38. In this case, advantage is taken of the fact that the angle at which impurity ions are implanted is smaller at the inclined portion than at the bottom portion.

That is, the n+-type region and n-type region are formed at a single step, not separate steps, in the manufacture of the memory cell, saving an additional mask alignment step. In actual practice, however, this method presents problems since a concentration ratio between the n+-type region and the n-type region depends solely upon an angle of inclination at the inclined portion 38. The inclination angle necessary to obtain a desired concentration ratio is theoretically evaluated through calculation. For example, the inclination angle must be about 84° to obtain a concentration ratio of 1:10 and about 89° to obtain a concentration ratio of 1:100. It is, however, usually difficult to form such a sharp inclined portion 38 within an allowable range not affecting the concentration ratio. Even if this is possible, the field insulation layer 30 will be formed adjacent to the inclined portion 38 so as to enhance the area efficiency, failing to alleviate a resultant sharp step between the field insulation layer 30 and the bottom portion 36. As a result, there is a high possibility that, at a later step, an interconnection pattern to be formed above the element area through an insulation layer is broken at a boundary between the inclined portion 38 and the field insulation layer 30.

One embodiment of this invention will be explained below by referring to FIGS. 4A to 4H.

Figure 4A:
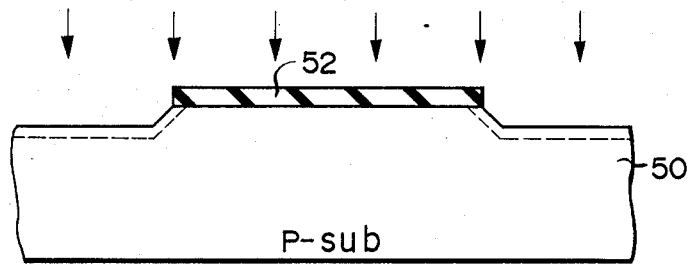
FIGS. 4A through 4H show the steps of manufacturing a floating gate MOS transistor according to one aspect of this invention.
Figure 4B:
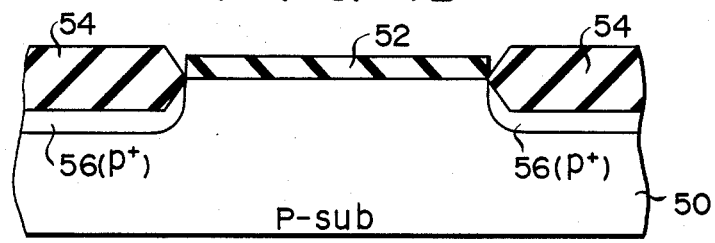
Figure 4C:
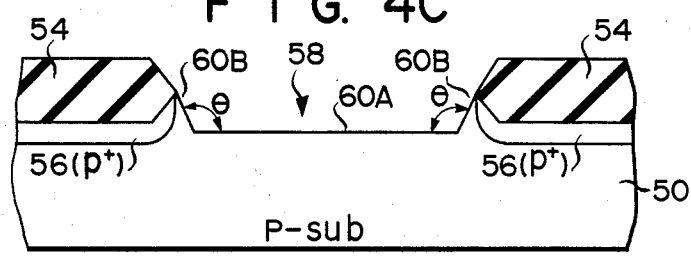
Figure 4D:
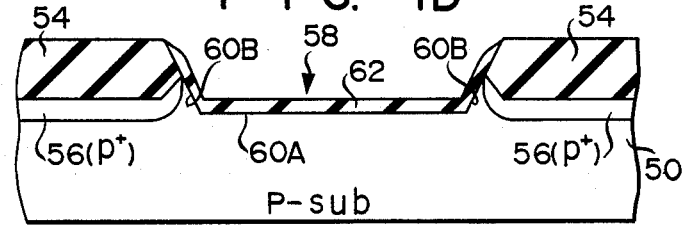
Figure 4E:
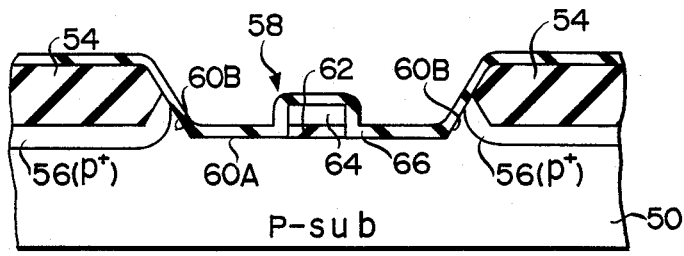
Figure 4F:
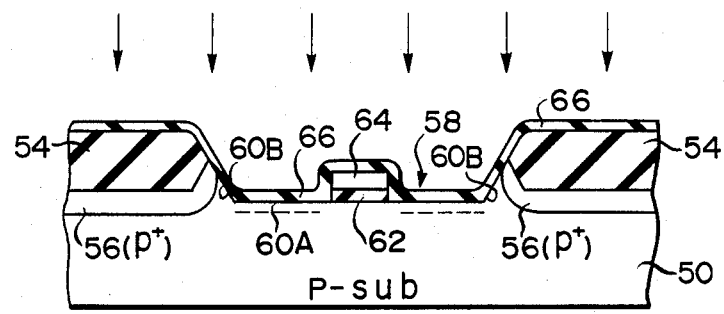
Figure 4G:
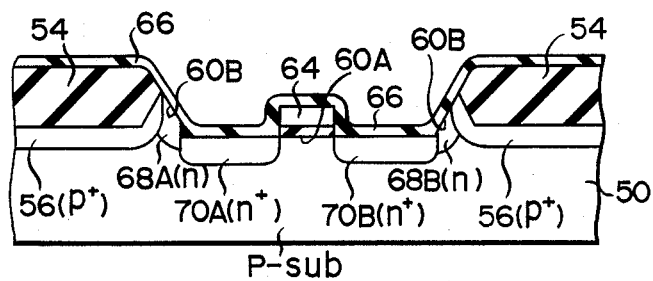
Figure 4H:
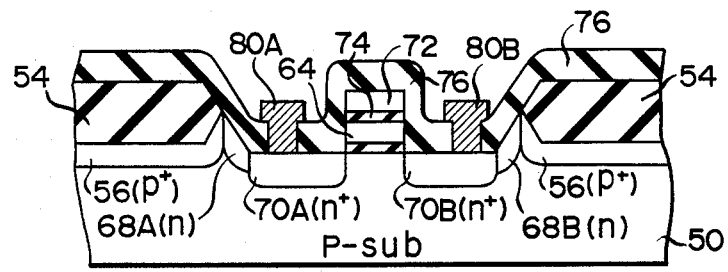

In this aspect of this invention, an n-channel floating gate MOS transistor is manufactured as an EPROM memory cell. FIGS. 4A through 4H show the steps of manufacturing a floating gate MOS transistor. In the first step of FIG. 4A, a p-type silicon substrate 50 is prepared. A silicon nitride pattern 52 is formed on the substrate 50 through a buffer oxide film (not shown). In this connection, the silicon nitride pattern 52 has a resistance to oxidation and selectively masks the surface of the substrate 50. The substrate 50 is etched with the silicon nitride pattern 52 as a mask, causing an unmasked, exposed surface portion of the substrate 50 to be removed in a predetermined thickness. Then, with the silicon nitride pattern 52 as a mask, p-type impurities (e.g., boron) are ion-implanted with a dose of $4 \times 10^{12}$ cm$^{-2}$ as shown in FIG. 4A. Then, the silicon substrate 50 is thermally oxidized in a wet atmosphere at 1,000° C. to form a field insulation layer 54 of a thickness of, for example, 6,000 Å on the unmasked portion of the substrate 50. The boron in the substrate 50 is activated and forms p+-type regions 56 of a concentration level of about $2 \times 10^{17}$ cm$^{-3}$ beneath the field insulation layer 54 as shown in FIG. 4B. The silicon nitride pattern 52 and buffer oxide film are removed to leave the exposed surface portion of the substrate 50. The exposed surface portion of the substrate 50 is etched anisotropically. Here, the field insulating layer 54 is used as a mask and, for example, a KOH solution is used as an anisotropic etching solution. A recess 58 is formed by the anisotropic etching step on the surface area of the substrate 50 as shown in FIG. 4C. The recess 58 has a flat or bottom portion 60A and an inclined portion 60B having an inclination angle of 60° ($\theta = 120°$; $\theta$ representing the angle between the bottom portion 60A and the inclined portion 60B of the recess). The substrate 50 is heat-treated in a dry oxygen atmosphere to form a thermal oxidation film 62 of a thickness of about 200 Å on the bottom portion 60A and the inclined portion 60B as shown in FIG. 4D. Then, a phosphorus-doped polysilicon film of a thickness of 3,000 Å is deposited by a CVD method on the surface of the field insulation layer 54 and thermal oxidation film 62. The polysilicon film is partially etched to leave an area for use as a floating gate electrode 64. At this etching step, the thermal oxidation film 62 is removed except for an area between the floating gate electrode 64 and the substrate 50, since it is very small in thickness. Then, an SiO$_2$ film 66 of a thickness of 200 Å is formed by the CVD method on the surface of the field insulation layer 54, recess 58 and floating gate electrode 64 as shown in FIG. 4E. Then, as shown in FIG. 4F, an n-type impurity, such as arsenic, is ion-implanted perpendicularly through the SiO$_2$ film 66 under a dose of $1\times10^{15}$ cm$^{-2}$ and an energy of 100 keV. In this ion-implanted step, the field insulation layer 54 and floating gate electrode 64 are used as a mask pattern against the substrate 50. Generally, when arsenic ions are implanted into SiO$_2$ under an energy of 100 keV, it can penetrate SiO$_2$ by a distance of about 340 Å. The arsenic ions form a Gaussian distribution within SiO$_2$ with a spot of 340 Å as a center. In this embodiment, arsenic ions must penetrate into a 400 Å (=200 Å $\times$ sec 60°)-thick SiO$_2$ film 66 on the inclined portion 60B and into a 200 Å-thick SiO$_2$ film 66 on the bottom portion 60A, until it reaches the substrate 50. Most of the arsenic ions to be moved toward the bottom 60A, can tunnel through the SiO$_2$ film 66, but most of the arsenic ions, which are moved toward the inclined portion 60B, cannot tunnel through the SiO$_2$ film 66 under the same conditions. In consequence, an impurity concentration in the neighborhood of the inclined portion 60B is set to be two orders of magnitude lower than that in the neighborhood of the bottom portion 60A. When the arsenic ions in the substrate 50 are activated by a heat treatment, n$^+$-type regions 70A, 70B are formed under the bottom portion 60A as shown in FIG. 4G and n-type regions 68A, 68B are also formed under the inclined portion 60B of the recess as to be located between the p$^+$-type region 56 and the n$^+$-type regions 70A and 70B. The n$^+$-type region 70A and n-type region 68A correspond to the source of the floating gate MOS transistor and the n$^+$-type region 70B and n-type region 68B correspond to the drain of the floating gate MOS transistor. Then, the SiO$_2$ film 66 is removed. A control gate electrode 72 is formed on the floating gate electrode 64 through an oxide film 74 as shown in FIG. 4H. The control gate electrode 72 is made of a phosphorus-doped polysilicon. A SiO$_2$ film 76 is formed by a CVD method on the field insulation layer 54, n-type regions 68A, 68B, n$^+$-type regions 70A, 70B, floating gate electrode 64 and control gate electrode 72. Contact through holes are formed in the SiO$_2$ film 76 and an aluminium layer is formed on the SiO$_2$ film 76 and in contact with the n$^+$-type regions 70A and 70B through the respective through holes. The aluminium layer is separated by a patterning step to obtain a source electrode 80A and drain electrode 80B.

In this embodiment, the connection of the p$^+$-type region 56 to the n-type regions 68A and 68B permits this pn junction to have a higher reverse bias voltage. Since the p$^+$-type region 56 can be set at a sufficiently high level with the source and drain voltages sufficiently secured, it is possible to further decrease the thickness of the field insulation layer. The inclination angle of the inclined portion 60B can be set at an angle of about 60° and thus there is still a small chance that an interconnection pattern will be broken on the pn junction between the inclined portion 60B and the field insulation layer 54.

Since, in this manufacturing method, the n-type regions 68A and 68B and n$^+$-type regions 70A and 70B are formed in a single common step, it is possible to lower the manufacturing cost. This method permits a high integration density of the memory device and can assure a reliability with which the memory device is operated.

Although, in the above-mentioned embodiment, the SiO$_2$ layer 66 is formed by the CVD method to control the amount of ions implanted, use may be made of the other material, such as Si$_3$N$_4$, in place of the SiO$_2$ film 66. An oxide film or a nitride film may be formed by directly oxidizing or nitriding the flat portion 60A and inclined portion 60B. Although, in the above-mentioned embodiment, the semiconductor substrate is of a p-type conductivity, it may be of an n-type conductivity, provided that the conductivity types of the associated elements are correspondingly reversed. The semiconductor substrate is not restricted to the silicon substrate 50 and may be made of Ge or a compound such as GaAs.

Figure 5:
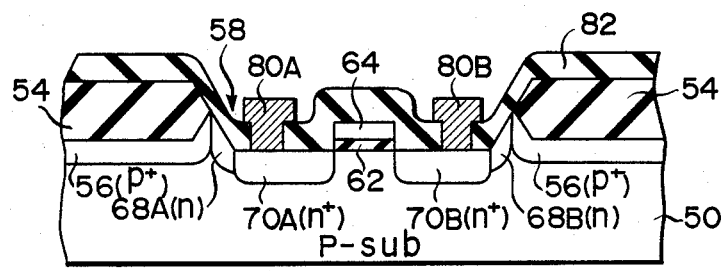
FIG. 5 shows an insulation gate MOS transistor as explaining another aspect of this invention.

Although this invention has been explained in connection with the manufacture of the floating gate MOS transistor, it is not restricted thereto. This invention is also applicable to the manufacture of an insulated-gate MOS transistor as shown in FIG. 5 in which case the same advantage can be obtained. In the manufacture of the MOS transistor as shown in FIG. 5, the SiO$_2$ film 66 is removed after the manufacturing step of FIG. 4G is carried out and an insulation layer 82 thicker than the SiO$_2$ film 66 is formed to protect associated elements. EPROM requires an ordinary insulated-gate MOS transistor as a peripheral circuit of a memory cell. In consequence, the insulated-gate MOS transistor can be efficiently formed utilizing a common step as in the case of the manufacture of the memory cell (i.e., the floating gate MOS transistor). In this connection it is to be noted that the MOS transistor in FIG. 5 can be utilized as a circuit element of a high voltage circuit.

Figure 6:
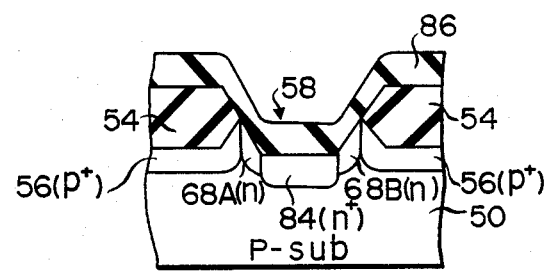
FIG. 6 shows a part of a semiconductor device for explanation which allows a high voltage to be induced on the MOS transistor shown, for example, in FIGS. 4H and 5.

This invention can also be applied to the manufacture of an impurity diffused layer for use as a connection line for supplying high voltage to a EPROM memory and its peripheral circuit on a semiconductor device as shown in FIG. 6. In the connection line area, a mask pattern for use as a substitute for a gate electrode is not formed within the recess 58. For this reason, n-type regions 68A, 68B and n$^+$-type region 84 are formed in an element area of a semiconductor substrate by the implantation of impurity ions and the annealing step.

What is claimed is:
1. A method for manufacturing a semiconductor device, comprising the steps of:
   (1) forming, in the surface area of a semiconductor substrate, a flat surface and an inclined surface adjacent said flat surface and at a predetermined angle thereto;
   (2) forming a covering layer of a uniform thickness on said flat and inclined surfaces;
   (3) implanting impurity ions into the substrate through said covering layer in a direction substantially perpendicular to said flat surface; and
   (4) annealing the ion-implanted substrate, thereby forming first and second regions of different impurity concentration below said flat and inclined surfaces, respectively, the impurity concentrations being dependent from the predetermined angle.

2. A method according to claim 1, wherein said step (1) includes a substep of forming a recess in the surface area of said substrate by anisotropically etching the substarate, said recess having said inclined surface as a side and said flate surface as a bottom.

3. A method according to claim 1, wherein said step (2) includes a substep of depositing silicon oxide on said flat and inclined surfaces by CVD process.

4. A method according to claim 1, wherein said step (2) includes a substep of depositing silicon nitride on said flat and inclined surfaces by CVD process.

5. A method according to claim 1, wherein said semiconductor substrate is formed of silicon, and said step (2) includes a substep of oxidizing said flat and inclined surfaces.

6. A method according to claim 1, wherein said semiconductor substrate is formed of silicon, and said step (2) includes a substep of nitriding said flat and inclined surfaces.

7. A method for manufacturing a semiconductor device, comprising the steps of:
(1) forming a field insulation layer on a semiconductor substrate of a first conductivity type of divide the surface area of said substrate into a plurality of element areas;
(2) forming a recess in at least on of said element areas, said recess having a flat bottom and an inclined side;
(3) forming a gate insulation layer on a part of said flat bottom and a gate electrode on said gate insulation layer;
(4) forming a covering layer of uniform thickness on the flat bottom and inclined side;
(5) implanting impurity ions of a second conductivity type into said element area through said covering layer in a direction substantially perpendicular to said flat bottom; and
(6) annealing the ion-implanted substrate, thereby forming first and second regions as drain and source regions, respectively, below said flat bottom, sand a third region below said inclined side and in contact with said first region.

8. A method according to claim 7, wherein said step (2) includes a substep of forming said recess by anisotropically etching said element area with said field insultation layer used as a mask.

9. A method according to claim 8, further comprising a step (7) of forming a fourth region of said first conductivity type immediately below said field insulation layer in contact with said third region, said fourth region having a impurity concentration level higher than that of said substrate.

10. A method according to claim 9, wherein said step (4) includes a substep of forming said covering layer on the first gate electrode, flat bottom and inclined side, and which further comprises a step (8) of forming a second gate electrode over the first gate electrode through said covering layer.

11. A method for manufacturing a semiconductor device, comprising the steps of:
(1) forming a field insulation layer of a semiconductor substrate of a first conductivity type of divide the surface area of said substrate ino a plurality of element areas;
(2) forming a recess in at least one of said element areas, said recess having first and second inclined sides and a flat bottom;
(3) forming a gate insulation layer on a part of said flat bottom and gate electrode on said gate insulation layer;
(4) forming a covering layer on the flat bottom and the first and second inclined sides with a uniform thickness;
(5) implanting impurity ions of a second conductivity type into said element area through said covering layer in a direction substantially perpendicular to said flat bottom; and
(6) annealing the ion-implanted substrate, thereby forming first and second regions as a drain and source below said flat bottom, a third region below said first inclined side in contact with said first region and fourth region below said second inclined side in contact with said second region.

* * * * *